United States Patent
Huang et al.

(10) Patent No.: US 7,965,481 B2
(45) Date of Patent: Jun. 21, 2011

(54) HIGH VOLTAGE TOLERANCE CIRCUIT

(75) Inventors: Shao-Chang Huang, Hsinchu (TW); Wei-Yao Lin, Hsinchu County (TW); Tsung-Mu Lai, Hsinchu County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 363 days.

(21) Appl. No.: 12/166,342

(22) Filed: Jul. 2, 2008

(65) Prior Publication Data

US 2010/0002344 A1   Jan. 7, 2010

(51) Int. Cl.
*H02H 9/00* (2006.01)
(52) U.S. Cl. .......... 361/56; 361/91.1; 361/91.5; 361/58; 361/111
(58) Field of Classification Search ............. 361/56, 361/111, 91.1, 91.5, 58, 54, 119; 327/314
See application file for complete search history.

(56) References Cited

U.S. PATENT DOCUMENTS

| | | | | |
|---|---|---|---|---|
| 6,327,125 | B1 * | 12/2001 | Colclaser et al. | 361/56 |
| 7,064,942 | B2 * | 6/2006 | Ker et al. | 361/56 |
| 7,209,332 | B2 * | 4/2007 | Stockinger et al. | 361/56 |
| 7,271,988 | B2 * | 9/2007 | Chung et al. | 361/56 |
| 7,660,086 | B2 * | 2/2010 | Rodgers et al. | 361/56 |
| 2007/0285854 | A1 * | 12/2007 | Rodgers et al. | 361/56 |

* cited by examiner

*Primary Examiner* — Patrick Salce
(74) *Attorney, Agent, or Firm* — Winston Hsu; Scott Margo

(57) ABSTRACT

A high voltage tolerance circuit includes a first transistor, a second transistor, a third transistor, and a latch-up device. The first transistor and the second transistor are controlled by a control signal. The gate of the third transistor is coupled to a ground through the first transistor. The gate of the third transistor is coupled to an I/O pad through the second transistor. The third transistor is coupled between a power supply and a node. The latch-up device is coupled between the node and the I/O pad.

4 Claims, 7 Drawing Sheets

HIGH VOLTAGE TOLERANCE CIRCUIT

BACKGROUND OF THE INVENTION

1. Field of the Invention

The present invention relates to a high voltage tolerance circuit, and more particularly, to a high voltage tolerance circuit for programming operation, latch-up test, and ESD protection.

2. Description of the Prior Art

A traditional semiconductor I/O circuit commonly comprises a "pull-up" device and a "pull-down" device. The term "pull-up" device refers to the circuitry adapted to pull an output node to a desirable logical high voltage, e.g. 3.3 volts or 5 volts, whereas the term "pull-down" device refers to the circuitry adapted to pull an output node to a desirable logical low voltage, e.g. 0 voltages.

Please refer to FIG. 1. FIG. 1 is a schematic diagram of a driving circuit 10 according to the prior art. The driving circuit 10 comprises a P-type MOS pull-up transistor MP and an N-type MOS pull-down transistor MN. The P-type MOS pull-up transistor is typically formed in an N-well to facilitate the use of CMOS technology in forming N-type MOS pull-down transistors for an I/O pad 12. However, as a result of the P-type MOS pull-up transistor MP being formed in an N-well, when the I/O pad 12 receives an input signal having a voltage that sufficiently exceeds a voltage of a power supply Vs, current may be drawn through the P-type MOS pull-up transistor MP to the power supply. Thus, the driving circuit 10 is not suitable for a high voltage input, such as programming operation.

SUMMARY OF THE INVENTION

According to an embodiment of the present invention, a high voltage tolerance circuit comprises a first transistor, a second transistor, a third transistor, and a latch-up device. A source and a body of the first transistor are coupled to a ground. A gate of the first transistor receives a control signal. A drain of the first transistor is coupled to a first node. A source and a body of the second transistor are coupled to an I/O pad. A gate of the second transistor receives the control signal. A drain of the second transistor is coupled to the first node. A source and a body of the third transistor are coupled to a second node. A gate of the third transistor is coupled to the first node. A drain of the third transistor is coupled to a power supply. The latch-up device is coupled between the second node and the I/O pad.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
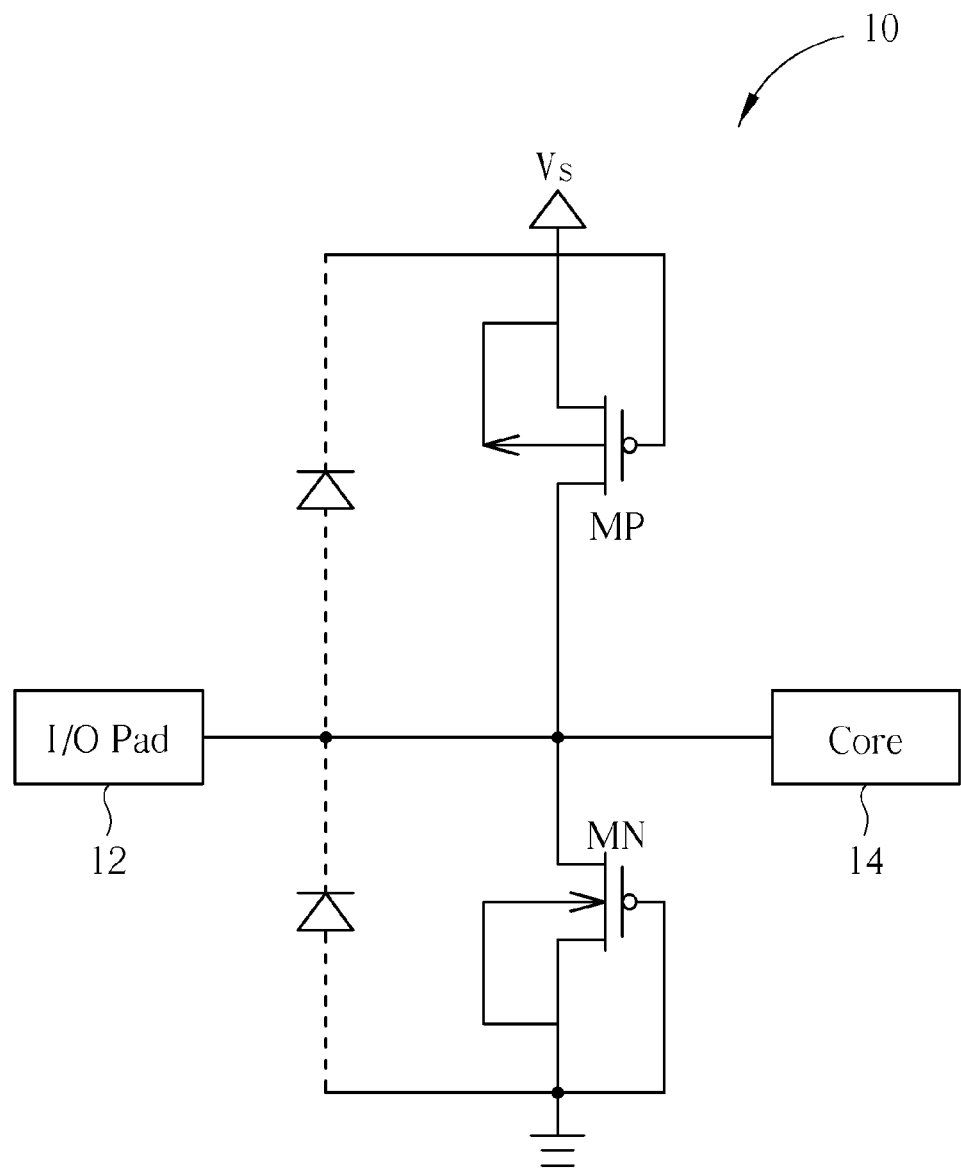
FIG. 1 is a schematic diagram of a driving circuit according to the prior art.
Figure 2:
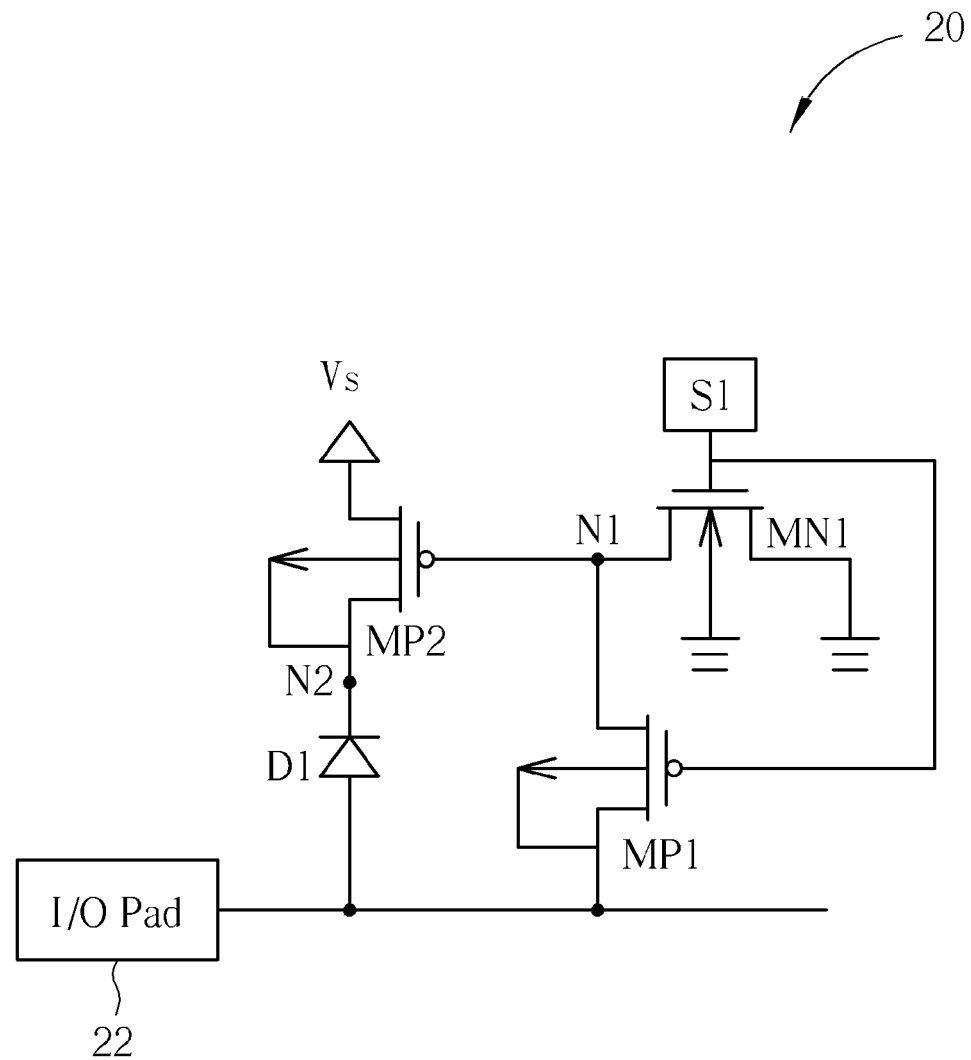
FIG. 2 is a schematic diagram of a first embodiment of a high voltage tolerance circuit according to the present invention.

Please refer to FIG. 2. FIG. 2 is a schematic diagram of a first embodiment of a high voltage tolerance circuit 20 according to the present invention. The high voltage tolerance circuit 20 comprises an N-type MOS transistor MN1, a P-type MOS transistor MP1, a P-type MOS transistor MP2, and a diode D1. A source and a body of the transistor MN1 are coupled to a ground. A gate of the transistor MN1 receives a control signal S1. A drain of the transistor MN1 is coupled to a first node N1. A source and a body of the transistor MP1 are coupled to an I/O pad 22. A gate of the transistor MP1 receives the control signal S1. A drain of the transistor MP1 is coupled to the first node N1. A source and a body of the transistor MP2 are coupled to a second node N2. A gate of the transistor MP2 is coupled to the first node N1. A drain of the transistor MP2 is coupled to a power supply Vs. A first end of the diode D1 is coupled to the I/O pad 22, and a second end of the diode D1 is coupled to the second node N2. In this embodiment, the voltage of the ground is 0V, and the power supply Vs provides a voltage about 3.3V. The high voltage tolerance circuit 20 provides the I/O pad 22 for programming with a high voltage. The diode D1 and the transistor MP2 provide a latch-up current dissipation path for the I/O pad 22. In addition, the diode D1 and the transistor MP2 provide an ESD dissipation path for the I/O pad 22. The transistor MN1 and the transistor MP1 are used to control the transistor MP2. The high voltage tolerance circuit 20 can operate in three conditions, including normal operation, latch-up test operation, and programming operation.

Figure 3:
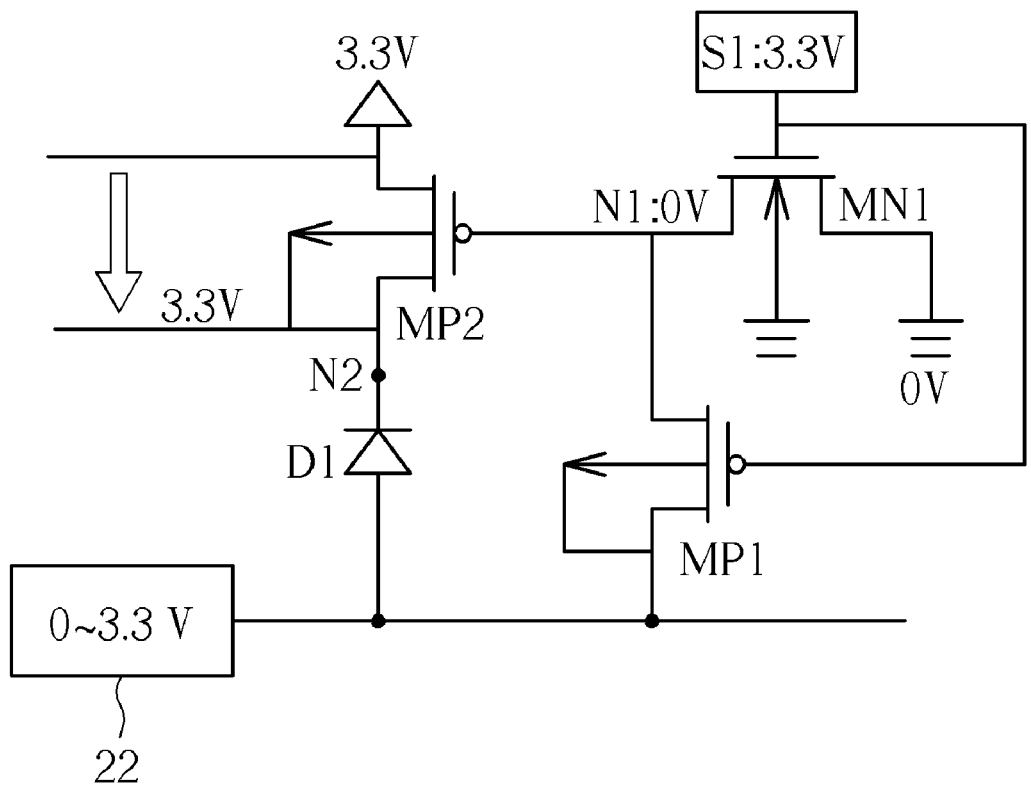
FIG. 3 is a schematic diagram of the high voltage tolerance circuit performing the normal operation.

Please refer to FIG. 3. FIG. 3 is a schematic diagram of the high voltage tolerance circuit 20 performing the normal operation. The I/O pad 22 is inputted an operating voltage about 0V to 3.3V and the control signal S1 is given a high voltage about 3.3V. When the control signal S1 is at the high voltage level, the transistor MN1 is turned on and the transistor MP1 is turned off. The node N1 is coupled to the ground through the transistor MN1, so the transistor MP2 is turned on. The node N2 is coupled to the power supply Vs through the transistor MP2, so the diode D1 is reverse biased. Thus, the diode D1 will not be turned on, and no leakage current is generated in the normal operation.

Figure 4:
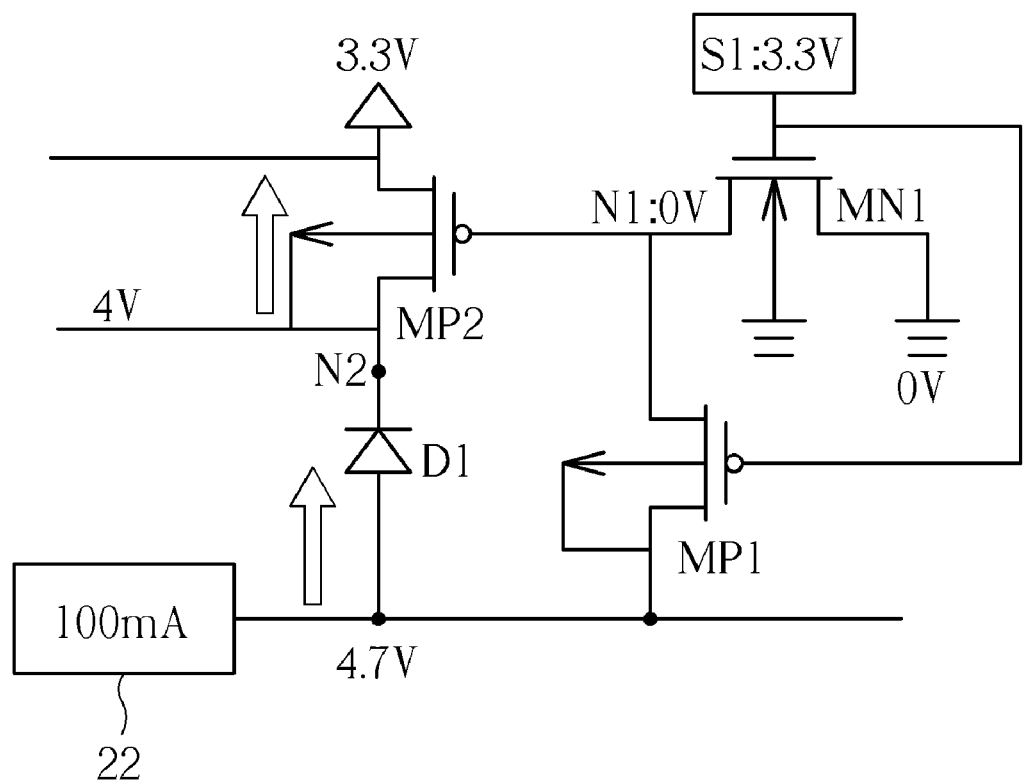
FIG. 4 is a schematic diagram of the high voltage tolerance circuit performing the condition of the latch-up test operation.

Please refer to FIG. 4. FIG. 4 is a schematic diagram of the high voltage tolerance circuit 20 performing the condition of the latch-up test operation. The I/O pad 22 is inputted a large current about 100 mA and the control signal S1 is given a high voltage about 3.3V. When the control signal S1 is at the high voltage level, the transistor MN1 is turned on and the transistor MP1 is turned off. The node N1 is coupled to the ground through the transistor MN1, so the transistor MP2 is turned on. The node N2 is coupled to the power supply Vs through the transistor MP2. However, the voltage of the I/O pad 22 will rise to 4V~4.7V, causing forward biasing of the diode D1. Thus, the diode D1 is turned on to dissipate the latch-up current.

Figure 5:
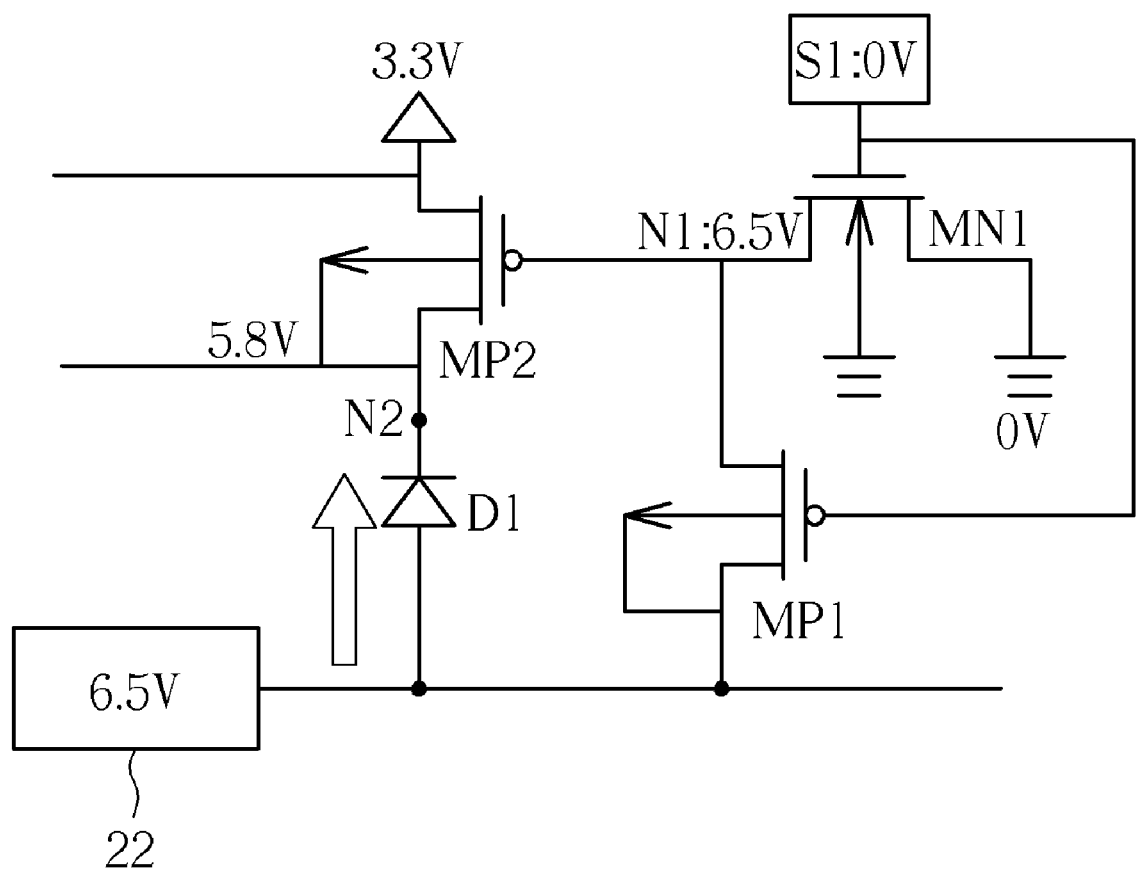
FIG. 5 is a schematic diagram of the high voltage tolerance circuit performing the condition of the programming operation.

Please refer to FIG. 5. FIG. 5 is a schematic diagram of the high voltage tolerance circuit 20 performing the condition of the programming operation. The I/O pad 22 is inputted a programming voltage about 6.5V and the control signal S1 is given a low voltage about 0V. When the control signal S1 is at the low voltage level, the transistor MN1 is turned off and the transistor MP1 is turned on. The node N1 is coupled to the I/O pad 22 through the transistor MP1, so the transistor MP2 is turned off. The node N2 is coupled to the I/O pad 22 through the diode D1 with a floating voltage about 5.8V. Thus, no leakage current is generated in the programming operation.

Figure 6:
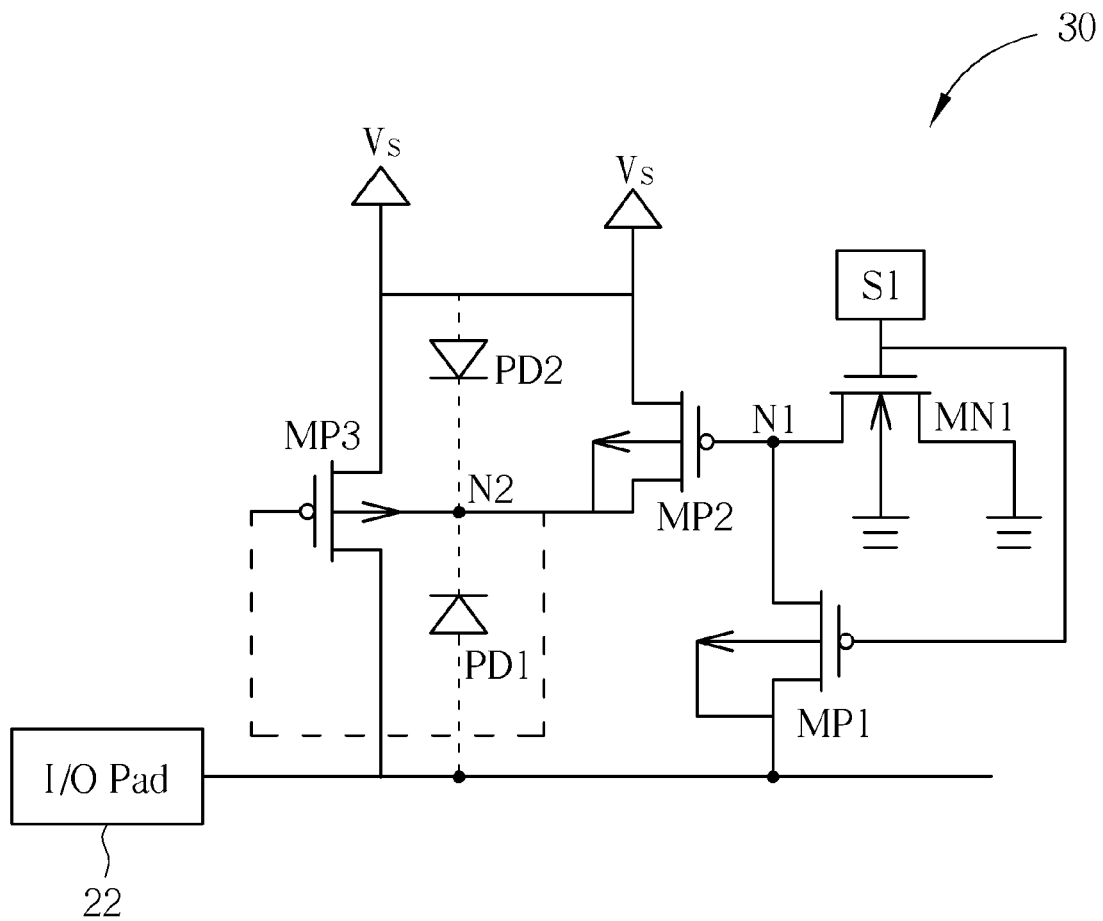
FIG. 6 is a schematic diagram of a second embodiment of a high voltage tolerance circuit according to the present invention.

Please refer to FIG. 6. FIG. 6 is a schematic diagram of a second embodiment of a high voltage tolerance circuit 30 according to the present invention. The high voltage tolerance circuit 30 comprises an N-type MOS transistor MN1, a P-type MOS transistor MP1, a P-type MOS transistor MP2, and a P-type MOS transistor MP3. In the second embodiment, the transistor MP3 is used to replace the diode D1 of the first embodiment. A body of the transistor MP3 is coupled to the second node N2. A gate of the transistor MP3 is coupled to the body of the transistor MP3. A drain of the transistor MP3 is coupled to the I/O pad 22. A source of the transistor MP3 is coupled to the power supply Vs. Except for the transistor MP3, the connection of the transistor MN1, MP1, and MP2 are the same as the first embodiment. The transistor MN1 and the transistor MP1 are used to control the transistor MP2. The transistor MP3 and the transistor MP2 provide a latch-up current dissipation path (parasitic diode PD1) for the I/O pad 22. In addition, the transistor MP3 provides two directional ESD dissipation paths (parasitic diode PD1 and PD2) for the I/O pad 22. In the second embodiment, the operation of the high voltage tolerance is the same as the first embodiment.

Figure 7:
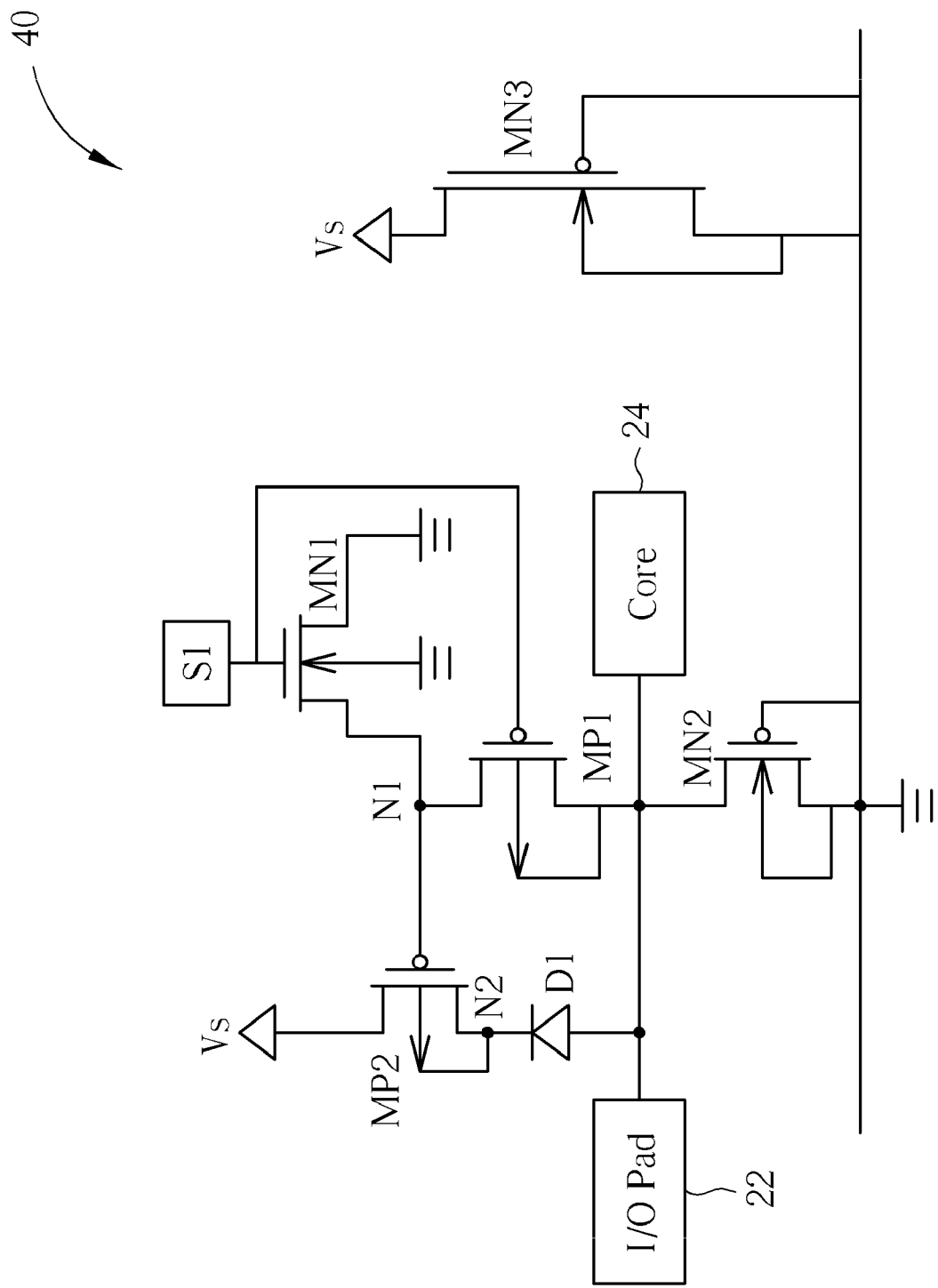
FIG. 7 is a schematic diagram of a third embodiment of a high voltage tolerance circuit according to the present invention.

Please refer to FIG. 7. FIG. 7 is a schematic diagram of a third embodiment of a high voltage tolerance circuit 40 according to the present invention. In this embodiment, the high voltage tolerance circuit 40 is implemented in a full chip. The high voltage tolerance circuit 40 comprises an N-type MOS transistor MN1, a P-type MOS transistor MP1, a P-type MOS transistor MP2, a diode D1, an N-type MOS transistor MN2, and an N-type MOS transistor MN3. The connection of the transistor MN1, MP1, and MP2 and the diode D1 are the same as the first embodiment. A source, a body and a gate of the transistor MN2 are coupled to the ground. A drain of the transistor MN2 is coupled to the I/O pad 22. The transistor MN2 is used for negative latch-up current dissipation. A source, a body and a gate of the transistor MN3 are coupled to the ground. A drain of the transistor MN3 is coupled to the power supply Vs. The transistor MN3 is used for ESD protection between the ground and the power supply Vs. The I/O pad 22 coupled to a core circuit can provide the normal operation, the latch-up test operation, and the programming operation.

In conclusion, a high voltage tolerance circuit according to the present invention comprises a first transistor, a second transistor, a third transistor, and a latch-up device. The latch-up device could be a diode or a fourth transistor. A source and a body of the first transistor are coupled to a ground. A drain of the first transistor is coupled to a first node. A source and a body of the second transistor are coupled to an I/O pad. A drain of the second transistor is coupled to the first node. The first transistor and the second transistor are controlled by a control signal. A source and a body of the third transistor are coupled to a second node. A gate of the third transistor is coupled to the first node. A drain of the third transistor is coupled to a power supply. The gate of the third transistor is coupled to a ground through the first transistor. The gate of the third transistor is coupled to an I/O pad through the second transistor. The latch-up device is coupled between the second node and the I/O pad. Thus, the high voltage tolerance circuit can perform the normal operation, the latch-up test operation, and the programming operation.

Those skilled in the art will readily observe that numerous modifications and alterations of the device and method may be made while retaining the teachings of the invention.

What is claimed is:

1. A high voltage tolerance circuit, comprising:
   a first transistor, a source and a body of the first transistor being coupled to a ground, a gate of the first transistor receiving a control signal, a drain of the first transistor being coupled to a first node;
   a second transistor, a source and a body of the second transistor being coupled to an I/O pad, a gate of the second transistor receiving the control signal, a drain of the second transistor being coupled to the first node;
   a third transistor, a source and a body of the third transistor being coupled to a second node, a gate of the third transistor being coupled to the first node, a drain of the third transistor being coupled to a power supply; and
   a latch-up device coupled between the second node and the I/O pad;
   wherein the first transistor is an N-type MOS transistor, and the second transistor and the third transistor are P-type MOS transistors.

2. A high voltage tolerance circuit, comprising:
   a first transistor, a source and a body of the first transistor being coupled to a ground, a gate of the first transistor receiving a control signal, a drain of the first transistor being coupled to a first node;
   a second transistor, a source and a body of the second transistor being coupled to an I/O pad, a gate of the second transistor receiving the control signal, a drain of the second transistor being coupled to the first node;
   a third transistor, a source and a body of the third transistor being coupled to a second node, a gate of the third transistor being coupled to the first node, a drain of the third transistor being coupled to a power supply; and
   a fourth transistor, a source of the fourth transistor being coupled to the power supply, a body of the fourth transistor being coupled to the second node, a gate of the fourth transistor being coupled to the body of the fourth transistor, and a drain of the fourth transistor being coupled to the I/O pad.

3. The high voltage tolerance circuit of claim 1, wherein the first transistor is an N-type MOS transistor, and the second transistor, the third transistor, and the fourth transistor are P-type MOS transistors.

4. A high voltage tolerance circuit, comprising:
   a first transistor, a source and a body of the first transistor being coupled to a ground, a gate of the first transistor receiving a control signal, a drain of the first transistor being coupled to a first node;
   a second transistor, a source and a body of the second transistor being coupled to an I/O pad, a gate of the second transistor receiving the control signal, a drain of the second transistor being coupled to the first node;
   a third transistor, a source and a body of the third transistor being coupled to a second node, a gate of the third transistor being coupled to the first node, a drain of the third transistor being coupled to a power supply; and
   a diode, a first end of the diode being coupled to the I/O pad, and a second end of the diode being coupled to the second node.

* * * * *